(12) United States Patent
Fujiwara et al.

(10) Patent No.: US 8,164,100 B2
(45) Date of Patent: Apr. 24, 2012

(54) SEMICONDUCTOR DEVICE AND METHOD OF MANUFACTURING THEREOF

(75) Inventors: Hirokazu Fujiwara, Aichi-ken (JP); Masaki Konishi, Toyota (JP); Eiichi Okuno, Mizuho (JP)

(73) Assignees: Toyota Jidosha Kabushiki Kaisha, Toyota-shi, Aichi-ken (JP); Denso Corporation, Kariya, Aichi-pref (JP)

( * ) Notice: Subject to any disclaimer, the term of this patent is extended or adjusted under 35 U.S.C. 154(b) by 504 days.

(21) Appl. No.: 12/338,151

(22) Filed: Dec. 18, 2008

(65) Prior Publication Data

US 2009/0159898 A1 Jun. 25, 2009

(30) Foreign Application Priority Data

Dec. 19, 2007 (JP) .................... 2007-327708

(51) Int. Cl.
*H01L 29/72* (2006.01)
(52) U.S. Cl. .................. 257/77; 117/89; 117/95
(58) Field of Classification Search ............ 257/77; 117/89, 95
See application file for complete search history.

(56) References Cited

U.S. PATENT DOCUMENTS

| | | | |
|---|---|---|---|
| 6,221,700 B1 | 4/2001 | Okuno et al. | |
| 6,270,573 B1 * | 8/2001 | Kitabatake et al. ............ | 117/95 |
| 6,884,644 B1 | 4/2005 | Slater, Jr. et al. | |
| 2002/0179910 A1 | 12/2002 | Slater, Jr. | |
| 2004/0171204 A1 | 9/2004 | Slater, Jr. et al. | |

FOREIGN PATENT DOCUMENTS

| | | |
|---|---|---|
| EP | 2 083 448 | 7/2009 |
| JP | 11-121744 | 4/1999 |
| JP | 11-162850 | 6/1999 |
| JP | 2000-101099 | 4/2000 |
| JP | 2000-106371 | 4/2000 |
| JP | 2000-340520 | 12/2000 |
| JP | 2001-53293 | 2/2001 |
| JP | 2002-261041 | 9/2002 |
| JP | 2003-86802 | 3/2003 |
| JP | 2003-86816 | 3/2003 |
| JP | 2003086802 | * 3/2003 |
| JP | 2005-508087 | 3/2005 |
| WO | WO 2008/056698 | 5/2008 |

OTHER PUBLICATIONS

Notification of Reasons for Rejection for JP 2007-327708 dated Nov. 10, 2009.

* cited by examiner

*Primary Examiner* — Edward Wojciechowicz
(74) *Attorney, Agent, or Firm* — Finnegan, Henderson, Farabow, Garrett & Dunner, LLP

(57) ABSTRACT

A semiconductor device is provided in which the contact resistance of the interface between an electrode and the semiconductor substrate is reduced. The semiconductor device includes a 4H polytype SiC substrate, and an electrode formed on a surface of the substrate. A 3C polytype layer, which extends obliquely relative to the surface of the substrate and whose end portion at the substrate surface is in contact with the electrode, is formed at the surface of the substrate. The 3C polytype layer has a lower bandgap than 4H polytype. Hence, electrons present in the 4H polytype region pass through the 3C polytype layer and reach the electrode. More precisely, the width of the passageway of the electrons is determined by the thickness of the 3C polytype layer. Consequently, with this semiconductor device, in which the passageway of the electrons is narrow, the electrons are able to reach the electrode at a speed close to the theoretical value, by the quantum wire effect. In this way, the contact resistance can be reduced in the semiconductor device.

2 Claims, 3 Drawing Sheets

NITROGEN IONS

SEMICONDUCTOR DEVICE AND METHOD OF MANUFACTURING THEREOF

CROSS-REFERENCE TO RELATED APPLICATION

The present application claims priority from Japanese Patent Application No. 2007-327708, which was filed on Dec. 19, 2007, the disclosure of which is herein incorporated by reference in its entirety.

BACKGROUND OF THE INVENTION

1. Field of the Invention

The present invention relates to a semiconductor device having a SiC (Silicon Carbide) substrate as its base, and a method for manufacturing the semiconductor device. More particularly, the present invention relates to a semiconductor device and a manufacturing method thereof that reduce the contact resistance at an ohmic junction between the substrate and an electrode.

2. Description of the Related Art

Semiconductor devices that use a 4H polytype or 6H polytype silicon carbide substrate for the semiconductor substrate that constitutes their base are well known. An example of such a semiconductor device is a Schottky diode. "Silicone carbide substrate" may be abbreviated to "SiC substrate" in the present specification. In the present specification, the term "polytype" may be used in place of "polytype structure" for short.

Electrodes are formed on the surfaces of the SiC substrate. Between the substrate and at least one electrode, an ohmic junction is formed. The electrical resistance at the ohmic junction is almost constant regardless of current or voltage. The electrical resistance (contact resistance) at the ohmic junction is preferably small. Hereinafter, the contact resistance at the ohmic junction may be termed simply the "contact resistance". A semiconductor device with a low contact resistance is disclosed in Japanese Patent Application Publication No. 2003-86802 (Patent Publication 1). The semiconductor device disclosed in Patent Publication 1 has an epitaxially grown 3C polytype formed on the SiC substrate surface layer where the SiC substrate contacts with the electrode. The 3C polytype is able to reduce the contact resistance due to having a lower bandgap than 4H polytype or 6H polytype. The terms "3C polytype", "4H polytype" and "6H polytype" refer to types of crystal structure. Particularly, "3C polytype" is sometimes called cubic crystal. "4H polytype" and "6H polytype" belong to hexagonal crystal.

BRIEF SUMMARY OF THE INVENTION

Low contact resistance is desirable. Disclosed herein is a semiconductor device in which contact resistance is reduced by a structure that differs from the structures of the related prior art.

When a 3C polytype layer is epitaxially grown at the surface of a SiC substrate, the 3C polytype layer spreads uniformly on that surface. Therefore, in the semiconductor device disclosed in Patent Publication 1, the electrons flowing between the 4C or 6H polytype SiC substrate and the electrode flow across the 3C polytype layer in the direction of its thickness. Because of this, the width of the passageway of the electrons (the width of a cross-section cut across the direction of flow of the electrons) is large. The larger the width of the passageway of the electrons, the more the scattering factors in the electrons increases. For that reason, the larger the width of the passageway of the electrons, the slower the speed of the electrons. The speed of the electrons may be referred to as the electron mobility. To express that conversely, the scattering factors of the electron decrease as their passageway becomes narrower, and so the narrower the passageway of the electrons, the nearer the substantial speed of electrons to the theoretical electron mobility. This effect is called the "quantum wire effect". The present invention utilizes this quantum wire effect to reduce the contact resistance between the SiC substrate and the electrode.

One technique taught in the present specification is to form, on a 4H or 6H polytype SiC substrate, a 3C polytype layer that extends obliquely from the surface thereof in the depth direction. Also, an end portion of the 3C polytype layer at the surface of the SiC substrate is in contact with an electrode formed on the surface of the SiC substrate.

In other words, the semiconductor device disclosed herein has a 3C polytype layer that slants relative to the surface of the SiC substrate, and one of whose edges contacts with an electrode. In such semiconductor device, the electrons present in the 4H or 6H polytype portion in the SiC substrate move to the 3C polytype layer, which has a lower bandgap than the 4H or 6H polytype. Since it extends obliquely in the depth direction of the SiC substrate, the 3C polytype layer is in contact with the 4H or 6H polytype over a broad area. Consequently, a large number of electrons can move rapidly to the 3C polytype layer from the 4H or 6H polytype. The electrons moved into the 3C polytype layer will flow along the 3C polytype layer and reach the electrode. In the semiconductor device having obliquely extending 3C polytype layer, the width of the passageway of the electrons is determined by the thickness of the 3C polytype layer. Because the 3C polytype layer extends obliquely in the depth direction of the SiC substrate, the layer can be formed to have a small thickness. Consequently, with the semiconductor device disclosed herein, the electrons are able to move toward the electrode at a speed close to the theoretical electron mobility, by the aforementioned quantum wire effect. With the semiconductor device disclosed herein, the electrons are able to flow to the electrode at a high speed by the quantum wire effect, thereby reducing the contact resistance.

Also the present specification discloses a manufacturing method suitable for manufacturing the semiconductor device described above. This manufacturing method includes the following steps. First of all, a 4H—SiC or 6H—SiC substrate in which 0001 planes slant relative to the substrate surface is prepared. Then either nitrogen ions or phosphorous ions are injected into the surface of the substrate prepared. Following that, the ion-injected substrate is heated so as to form at the surface layer thereof a 3C polytype layer that extends along the 0001 plane. Finally, an electrode is formed on the surface of the substrate so as to be in contact with an end portion of the 3C polytype layer. Note that the 0001 plane may be sometimes called the "C plane".

When a 3C polytype layer is formed by heating, the 3C polytype layer has the characteristics of readily growing along a 0001 plane. The manufacturing method makes use of such characteristics. By employing as the base substrate a 4H or 6H polytype SiC substrate in which the 0001 planes slant relative to the substrate surface, the manufacturing method enables a 3C polytype layer that slants relative to the surface of the SiC substrate to be formed with ease.

DETAILED DESCRIPTION OF THE INVENTION

Figure 1:
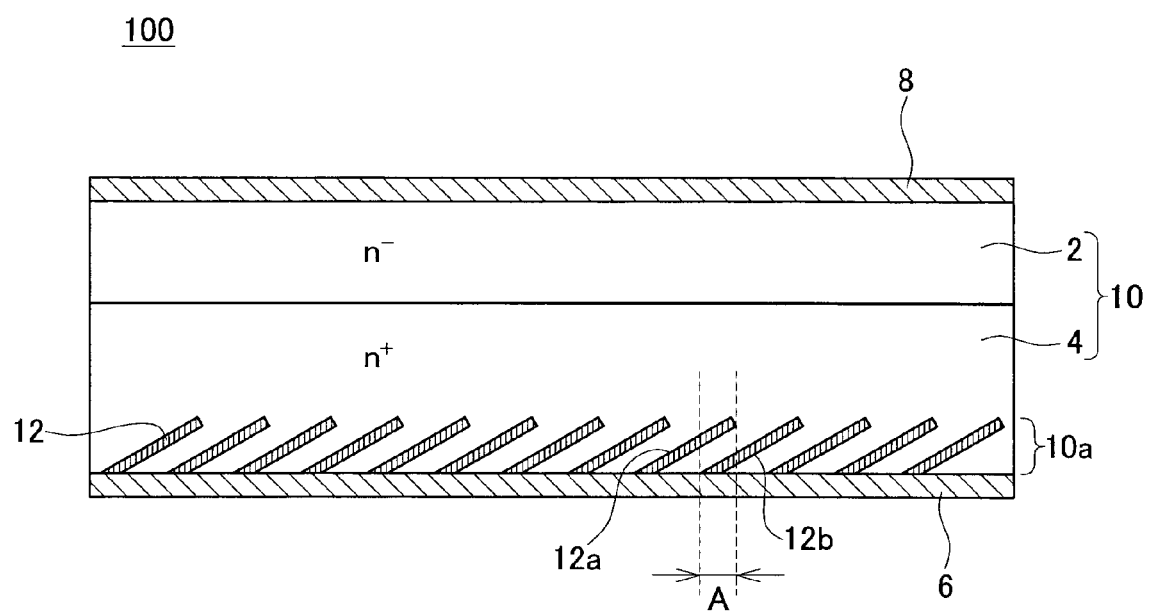
FIG. 1 is a schematic side view of a semiconductor device (diode) of a first embodiment.

<First Embodiment> A first embodiment of the invention is described, referring to FIG. 1. A semiconductor device of this embodiment is a Schottky diode 100 (abbreviated to the diode 100 hereinafter). FIG. 1 is a schematic cross-sectional view of the diode 100. For ease of understanding however, some of the hatching indicating the cross-section is omitted in FIG. 1.

The diode 100 uses an n type silicon carbide substrate 10 as its base substrate. The silicon carbide substrate 10 is termed simply the "substrate 10" below. The substrate 10 has overall 4H polytype. Instead of 4H polytype, the substrate 10 may alternatively have 6H polytype. The substrate 10 has an anode electrode 8 on one of its surfaces, and a cathode electrode 6 on the other surface. An n⁻ type drift layer 2 is formed in the portion of the substrate 10 that is adjacent to the anode electrode 8, and an n⁺ type cathode layer 4 is formed in the portion of the substrate 10 that is adjacent to the cathode electrode 6. The drift layer 2 and the cathode layer 4 are in contact. Namely, the substrate 10 has a two-layer structure constituted of the drift layer 2 and the cathode layer 4.

At the interface between the cathode electrode 6 and the cathode layer 4, the electrical resistance is constant, not being dependent on either voltage or current. In other words, the interface (junction plane) between the cathode electrode 6 and the cathode layer 4 forms an ohmic junction.

A Schottky barrier is formed at the interface between the anode electrode 8 and the drift layer 2. This means that current flows from the anode electrode 8 toward the drift layer 2, but does not flow from the drift layer 2 toward the anode electrode 8.

A plurality of 3C polytype layers 12 is formed on one surface layer 10a of the substrate 10. The surface layer 10a is positioned on the cathode electrode 6 side. One end of each 3C polytype layer 12 is exposed at the surface of the substrate 10. These exposed end portions are in contact with the cathode electrode 6. The plurality of 3C polytype layers 12 extend obliquely and in parallel in the depth direction of the substrate 10 from the surface of the substrate 10. Adjacent pairs of 3C polytype layers 12 (for instance, the two indicated by the reference symbols 12a and 12b in FIG. 1) are overlapped within a range marked "A" in FIG. 1. In other words, a part of adjacent pairs of 3C polytype layers are overlapped viewed in the depth direction of the substrate 10. Or to put it differently again, adjacent 3C polytype layers, such as 12a and 12b, are at least partially overlapped in the direction crossing through the surface of the substrate 10. In the diode 100, all adjacent 3C polytype layers are partially overlapped.

The advantages of the 3C polytype layers 12 extending obliquely in the depth direction of the substrate 10 are described. The 3C polytype layers 12 are cubic crystal. Generally, cubic crystal is prone to having structural defects (or stacking faults). However, stacking faults (or structural defects) exert the effect of rendering the bandgap smaller. With 4H polytype or 6H polytype, which belong to hexagonal crystal, the bandgap of silicon carbide is normally around 3.2 eV, whereas with 3C polytype, which is cubic crystal, the bandgap of silicon carbide is around 2.2 eV. Thus the bandgap with 3C polytype is lower than with 4H or 6H polytype. Hence, if the portions of the surface layer of the substrate 10 that are in contact with the cathode electrode 6 are 3C polytype, the contact resistance can be reduced compared to the case where such portions are formed with 4H or 6H polytype.

Those electrons that are present in the cathode layer 4 in places other than the 3C polytype layers move to the 3C polytype layers 12, where the bandgap is low. And then, the electrons move toward the cathode electrode 6 through the interior of the strip-formed 3C polytype layers 12. Thus, the width of the passageway of the electrons moving through the 3C polytype layers 12 is determined by the width of the 3C polytype layers 12, which is approximately 10 to 100 nanometers. It is well known that when electrons move through such a narrow width, scattering factors of the electrons decrease, so that the actual electron mobility (speed of the electrons) comes close to the theoretical electron mobility. With 3C polytype layers 12 extending obliquely in the depth direction, the actual speed of the electrons comes close to the theoretical value, and so the contact resistance is reduced.

Electrons present inside the cathode layer 4 migrate through the surfaces of the 3C polytype layers 12 (the interfaces contacting with the 4H polytype) into the 3C polytype layers 12. With the diode 100, the adjacent 3C polytype layers, such as 12a and 12b, are partially overlapped. Due to such overlap, the area of the interfaces between the 4H polytype region and the 3C polytype layers 12 is larger than that in the case where a 3C polytype layer is formed uniformly and in parallel with the surface of the substrate 10. Moreover, both surfaces of each of the 3C polytype layers 12 are in contact with the 4H polytype region. Hence, the area of the interfaces between the 3C polytype layers 12 and the 4H polytype region is, theoretically, equal to or more than twice that in the case where 3C polytype layer extends in parallel with the surface of the substrate 10. Because the area of the interfaces where the 4H polytype region and the 3C polytype layers 12 contact is large, electrons are able to move from the 4H polytype region to the 3C polytype layers 12 in large quantities. This feature of the interface area being large also contributes to reducing the contact resistance.

Figure 2A:
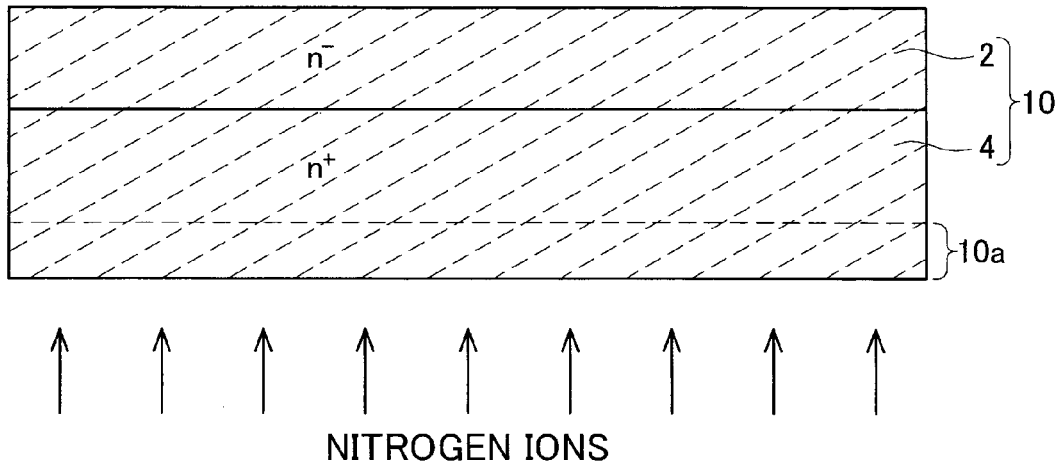
FIGS. 2A to 2C are schematic views for explaining processes for manufacturing the semiconductor device (diode)
Figure 2B:
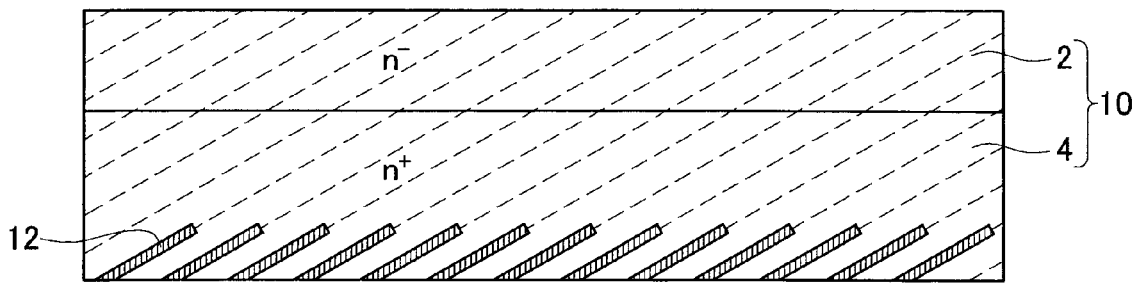
Figure 2C:
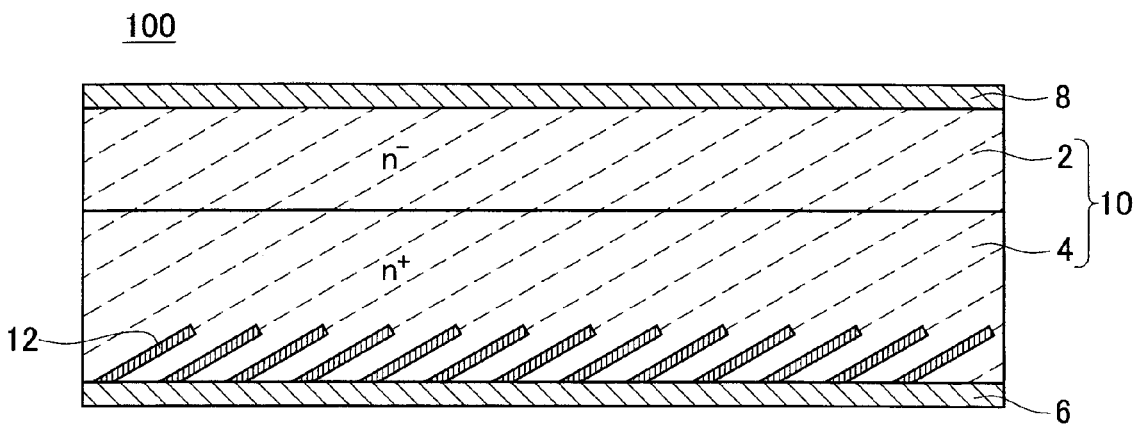

A manufacturing method suitable for manufacturing the diode 100 is described using FIGS. 2A to 2C. First of all, a 4H polytype or 6H polytype substrate 10 in which the 0001 planes slant relative to the substrate surface is prepared (FIG. 2A). The oblique dashed lines drawn inside the substrate 10 in FIGS. 2A to 2C denote the 0001 planes of the silicon carbide crystal. FIG. 2A shows the substrate 10 in which an n⁺ type cathode layer 4 and an n⁻ type drift layer 2 are formed.

Next, nitrogen ions are injected into the surface layer 10a of the cathode layer 4 (surface of the substrate 10). The doping concentration for injection of the nitrogen ions is preferably $1 \times 10^{20}$ cm$^{-3}$ or greater. More preferably, the doping concentration is $6 \times 10^{20}$ cm$^{-3}$ or greater. Such a doping concentration is not usually employed, as it entails excess ions being injected. However, doping with a higher concentration of ions than usual (that is, injecting excess ions into the interior of the silicon carbide crystal) results in the crystal structure of the silicon carbide becoming distorted when heated, thereby causing structural defects to readily occur.

Further, with this manufacturing method, the ion injection is carried out at room temperature. Usually, ion injection is carried out at around 500° C. in order to suppress occurrence of structural defects. However with this manufacturing method, the ions are intentionally injected at room temperature or a lower temperature level, in order to facilitate occurrence of structural defects. By injecting ions at a lower temperature than normal and at a higher doping concentration than normal, and by implementing the heat treatment to be described next, this manufacturing method forms 3C polytype layers 12 that contain large quantities of structural defects.

Next, the ion-injected substrate 10 is subjected to annealing treatment. That is, the substrate 10 is heated. The substrate 10 is heated in the range of 1200 to 1600° C. In this temperature range, structural defects (stacking faults) occur readily. At temperatures exceeding 1600° C., on the other hand, 4H polytype, 6H polytype and the like are prone to occur, and structural defects (stacking faults) are unlikely to occur. In the heating process, the ion-injected substrate 10 is heated to the aforementioned range at a rate of about 100° C./sec. After the heating, it is cooled to normal temperature, also at a rate of about 100° C./sec. When the substrate is heated to (and cooled back from) the aforementioned temperature range (and at the aforementioned temperature change rates), 3C polytype layers 12 are formed along the 0001 planes thereof (FIG. 2B). Being formed along the 0001 planes of the substrate 10, which slant relative to the surface of the substrate 10, the 3C polytype layers 12 also slant relative to the surface of the substrate 10.

Finally, the anode electrode 8 is formed on one surface of the substrate 10, and the cathode electrode 6 is formed on the other surface (FIG. 2C). An end portion of each 3C polytype layer 12 is exposed at the surface of the substrate 10, and contacts with the cathode electrode 6. The diode 100 is manufactured by the processes described above.

The manufacturing method uses a silicon carbide substrate 10 in which the 0001 planes slant relative to the surface. Due to the employment of such substrate 10, 3C polytype layers 12 that slant relative to the surface of the substrate 10 and whose exposed end portions contact with the cathode electrode 6 can be formed with ease. Although nitrogen ions are injected into the SiC substrate 10 in the foregoing embodiment, alternatively phosphorous ions may be injected instead of the nitrogen ions.

Figure 3:
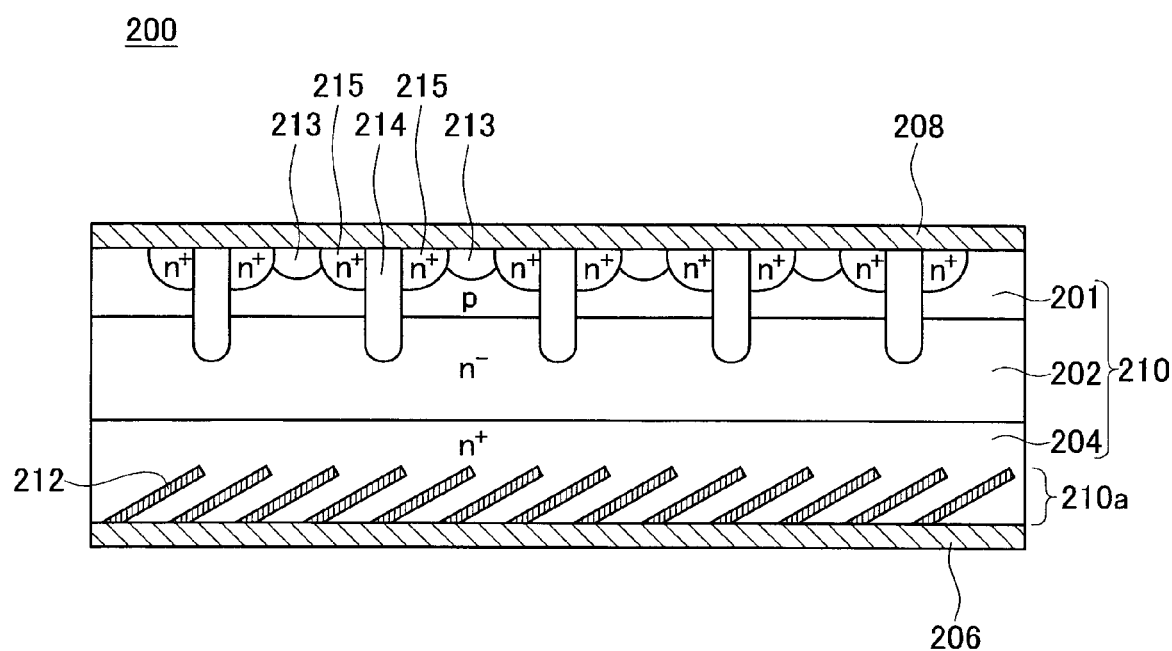
FIG. 3 is a schematic side view of a semiconductor device of a second embodiment.

<Second Embodiment> A semiconductor device of a second embodiment is described, referring to FIG. 3. The semiconductor device of this embodiment is a MOSFET 200. FIG. 3 is a schematic cross-sectional view of the MOSFET 200. For ease of understanding, some of the hatching indicating the cross-section is omitted in FIG. 3.

The MOSFET 200 employs a 4H polytype or 6H polytype silicon carbide substrate 210 ("substrate 210" below) as the base substrate. As can be seen in FIG. 3, an n$^+$ type drain layer 204 is formed in the lower part of the substrate 210. An n$^-$ type drift layer 202 is formed over the drain layer 204. A p type body layer 201 is formed over the drift layer 202.

A drain electrode 206 is formed on one surface of the substrate 210 (the surface on the side where the drain layer 204 is formed). A source electrode 208 is formed on the other surface of the substrate 210 (the surface on the side where the body layer 201 is formed).

In the body layer 201 there are formed trenches 214 that penetrate through the body layer 201 and reach the drift layer 202. Though omitted from the drawing, insulators are formed on the inner walls of the trenches 214, and the interiors thereof are filled with a conductive substance. The conductive substance in the trench 214 forms gate electrodes.

Although omitted from the drawing, an insulating layer is formed over the top of the trenches 214. A source electrode 208 is formed on the surface of the body layer 201. The source electrode 208 and the conductive substance inside the trenches 214 are insulated by the insulating layer.

On both sides of each trench 214, n$^+$ type source regions 215 are formed. Body contact regions 213 are formed between adjacent source regions 215. In FIG. 3, reference symbols are assigned only to one trench, to the source regions on both sides thereof, and to the body contact regions lying further outward on both sides thereof, reference symbols for the other trenches, source regions and body contact regions being omitted.

The source regions 215 and the body contact regions 213 contact the source electrode 208 with their surfaces. Electrical continuity is established between the body layer 201 and the source electrode 208 via the body contact regions 213. The substances between the source electrode 208 and the drain electrode 206 form a transistor.

On one surface layer 210a that faces the drain electrode 206, there are formed a plurality of 3C polytype layers 212. Description of the method for forming the 3C polytype layers 212 is the same as in the first embodiment, and therefore, is omitted here. Each of the 3C polytype layers 212 contacts the drain electrode 206 at an end portion thereof. The 3C polytype layers 212 extend from the surface of the substrate 210 in the depth direction of the substrate 210 while slanting relative to the surface of the substrate 210. In other words, the 3C polytype layers 212 obliquely extend from the surface of the substrate 210 in the depth direction of the substrate 210.

The interface of the drain electrode 206 with the drain layer 204 forms an ohmic contact. That is, the electrical resistance between the drain electrode 206 and the drain layer 204 is almost constant, not being dependent on either the voltage or the current applied.

Like the Schottky diode 100 of the first embodiment, the MOSFET 200 has the 3C polytype layers 212 that slant relative to the substrate surface. The 3C polytype layers 212 of the MOSFET 200 exert the same effects as the 3C polytype layers 12 of the Schottky diode 100 described above.

The technical features of the diode 100 of the first embodiment and the MOSFET 200 of the second embodiment may be stated in other words as follows. The semiconductor devices of these embodiments have an n-type SiC substrate and electrodes. The substrate has either a 4H or 6H polytype in which the 0001 planes slant relative to the substrate surface. The electrodes are formed on the surfaces of the SiC substrate. Formed in the SiC substrate are 3C polytype layers that extend along the 0001 planes and each have an end portion being in contact with an electrode at the substrate surface. The interface between such end portions of the 3C polytype layers and the electrode forms an ohmic contact. A particular feature is that a plurality of 3C polytype layers extends in parallel and obliquely relative to the surface of the SiC substrate, and adjacent 3C polytype layers are partially overlapped along the depth direction of the substrate.

Additional technical features of the semiconductor devices of the embodiments are listed below.

(1) The SiC substrate is an n-type semiconductor substrate.
(2) The manufacturing method for the semiconductor substrate includes a process in which either nitrogen ions or phosphorous ions are injected at high concentration into the surface of the SiC substrate. The ion injection is carried out under conditions of room temperature or lower.
(3) The manufacturing method includes a process in which the ion-injected SiC substrate is heated to a temperature range of 1200 to 1600° C. In this heating process, the ion-injected SiC substrate is heated to the aforementioned temperature range at a rate of around 100° C./sec. After the heating, the SiC substrate is cooled to room temperature, also at a rate of around 100° C./sec.

In the semiconductor devices set forth in the embodiments, the plurality of 3C polytype layers is preferably formed in parallel. More preferably, adjacent 3C polytype layers are partially overlapped when viewed from the top of the substrate. With such configuration, larger area of interfaces between the 4H or 6H polytype region and the 3C polytype layers can be obtained, compared to those in related prior art semiconductor devices, which have 3C polytype layer that uniformly extends in parallel with the substrate surface. With such configuration, both surfaces of the 3C polytype layers are in contact with the 4H or 6H polytype region, and therefore the area of the interfaces is, theoretically, equal to or more than twice that in the case where the 3C polytype layer extends in parallel with the substrate surface. Interfaces larger than in the related prior art increase the quantity of electrons (per unit time) that migrate from the 4H or 6H polytype region to the 3C polytype layers. A semiconductor device having such configuration is able to have large quantities of electrons migrate from the 4H or 6H polytype region to the 3C polytype layers, enabling reduction of the contact resistance. In a semiconductor device having such configuration, the quantum wire effect combines synergistically with the effects yielded by the large interfaces between the 4H or 6H polytype region and the 3C polytype layers, enabling even further reduction of the contact resistance.

The illustrated embodiments have been set forth in detail only for the purposes of clarity and example and should not be taken as limiting the invention as defined by the claims, which include the aforementioned examples and other examples variously modified or changed. Furthermore, the technical elements explained in the specification or drawings provide technical utility by themselves or in various combinations and are not limited to the combinations described in the claims in the patent application. Additionally, the techniques presented as examples in the specification or drawings are designed to achieve multiple purposes simultaneously, the achievement of any one of which will provide technical utility.

What is claimed is:

1. A semiconductor device comprising:
   a silicon carbide substrate of 4H or 6H polytype; and
   an electrode formed on a surface of the silicon carbide substrate; wherein a 3C polytype layer is formed in the silicon carbide substrate so as to extend obliquely from the surface of the silicon carbide substrate in the depth direction of the silicon carbide substrate, and an end portion of the 3C polytype layer at the surface of the silicon carbide substrate is in contact with the electrode, and all of the surfaces of the 3C polytype layer except for the end portion in contact with the electrode are in contact with the 4H or 6H polytype of the silicon carbide substrate.

2. The semiconductor device according to claim 1, wherein a plurality of 3C polytype layers is formed and adjacent 3C polytype layers are partially overlapped in the depth direction of the silicon carbide substrate.

\* \* \* \* \*